(12) United States Patent
Bruland

(10) Patent No.: US 7,315,038 B2
(45) Date of Patent: *Jan. 1, 2008

(54) METHODS AND SYSTEMS FOR POSITIONING A LASER BEAM SPOT RELATIVE TO A SEMICONDUCTOR INTEGRATED CIRCUIT USING A PROCESSING TARGET AS AN ALIGNMENT TARGET

(75) Inventor: Kelly J. Bruland, Portland, OR (US)

(73) Assignee: Electro Scientific Industries, Inc., Portland, OR (US)

(*) Notice: Subject to any disclaimer, the term of this patent is extended or adjusted under 35 U.S.C. 154(b) by 0 days.

This patent is subject to a terminal disclaimer.

(21) Appl. No.: 11/213,329

(22) Filed: Aug. 26, 2005

(65) Prior Publication Data

US 2007/0045574 A1 Mar. 1, 2007

(51) Int. Cl.
*G01N 21/00* (2006.01)
*B23K 26/00* (2006.01)

(52) U.S. Cl. .............................. 250/559.3; 250/559.29; 250/548; 356/614; 356/620; 438/128; 438/132; 219/121.6; 219/121.68; 219/121.69; 219/121.85

(58) Field of Classification Search ................ 250/548, 250/559.3, 559.29; 219/121.6, 121.68, 121.69, 219/121.82, 121.83, 121.85; 356/614, 620, 356/622; 438/128, 132
See application file for complete search history.

(56) References Cited

U.S. PATENT DOCUMENTS

| 4,358,659 | A | 11/1982 | Spohnheimer |
| 4,780,590 | A | 10/1988 | Griner et al. |
| 4,809,014 | A | 2/1989 | Kempter et al. |
| 4,877,175 | A | 10/1989 | Jones et al. |
| 4,941,082 | A | 7/1990 | Pailthorp et al. |
| 5,869,383 | A | 2/1999 | Chien et al. |
| 6,172,325 | B1 | 1/2001 | Baird et al. |
| 6,320,243 | B1 | 11/2001 | Jeong et al. |
| 6,483,071 | B1 | 11/2002 | Hunter et al. |
| 6,573,473 | B2 | 6/2003 | Hunter et al. |
| 6,593,542 | B2 | 7/2003 | Baird et al. |
| 6,750,424 | B2 | 6/2004 | Tanaka |

(Continued)

FOREIGN PATENT DOCUMENTS

DE 102 34 943.6 7/2002

(Continued)

OTHER PUBLICATIONS

International Search Report and Written Opinion of PCT/US2006/032944, Dec. 28, 2006.

*Primary Examiner*—Davienne Monbleau
(74) *Attorney, Agent, or Firm*—Stoel Rives LLP

(57) ABSTRACT

A method and system position a laser beam spot relative to a semiconductor substrate having structures on or within the semiconductor substrate to be selectively processed by delivering a processing laser beam to a processing laser beam spot. The method generates a metrology laser beam and propagates the metrology laser beam along a propagation path to a metrology laser beam spot on or near a structure to be selectively processed. The method detects a reflection of the metrology laser beam from the structure, thereby generating a reflection signal, and determining, based on the reflection signal, a position of the metrology laser beam spot relative to the structure.

40 Claims, 9 Drawing Sheets

U.S. PATENT DOCUMENTS

| | | |
|---|---|---|
| 6,816,294 B2 | 11/2004 | Unrath et al. |
| 6,972,268 B2 * | 12/2005 | Ehrmann et al. ............ 438/795 |
| 7,027,155 B2 * | 4/2006 | Cordingley et al. ......... 356/401 |
| 7,064,809 B2 * | 6/2006 | Kemper et al. ................ 355/72 |
| 2005/0096779 A1 | 5/2005 | Markoya |
| 2005/0168715 A1 | 8/2005 | Kemper et al. |

FOREIGN PATENT DOCUMENTS

WO    WO 2004/015747    2/2004

* cited by examiner

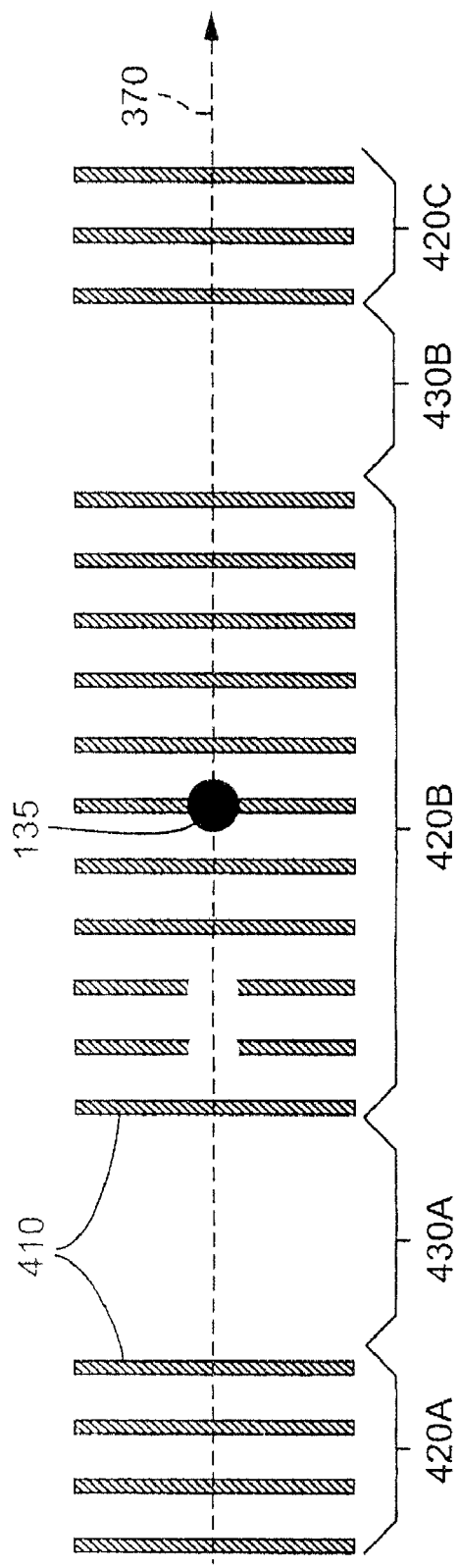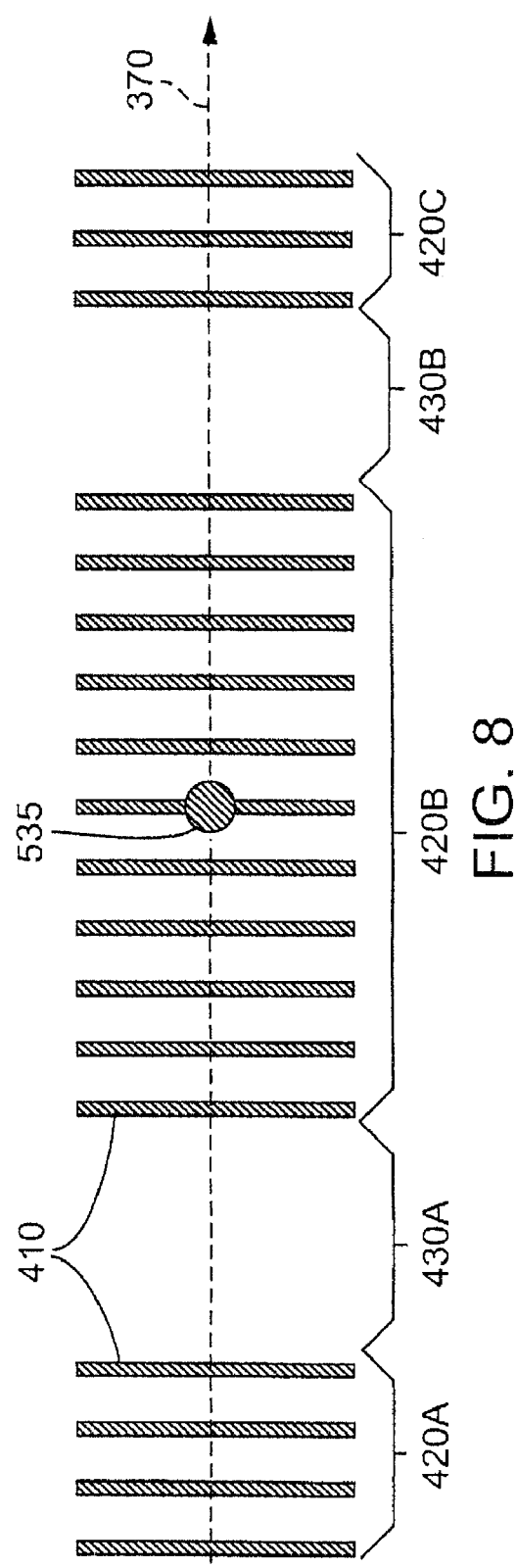

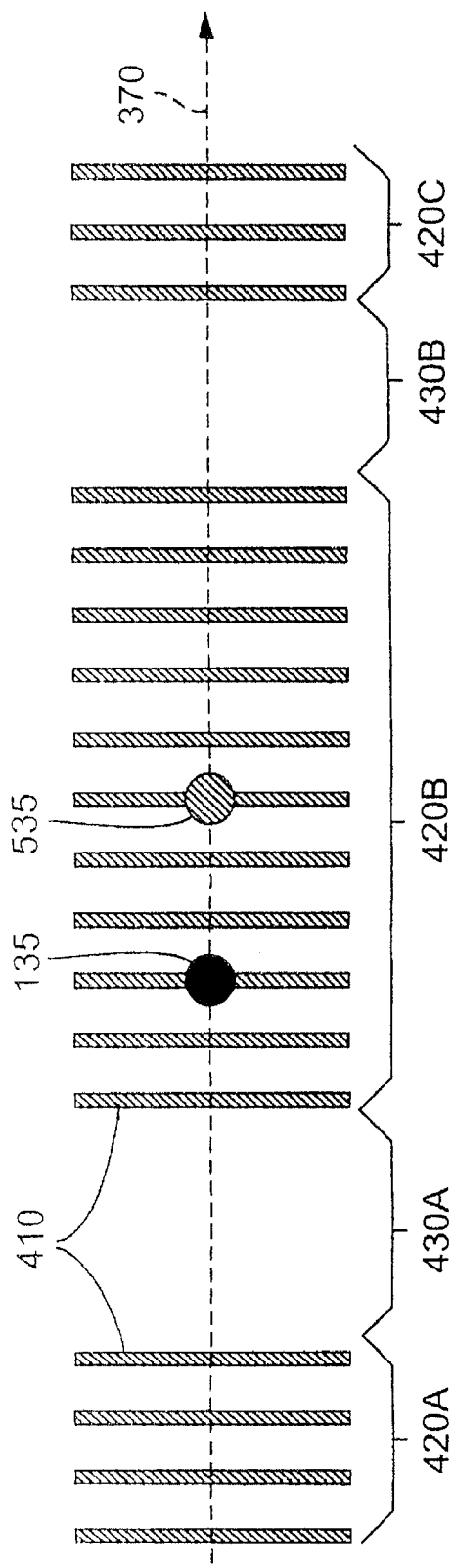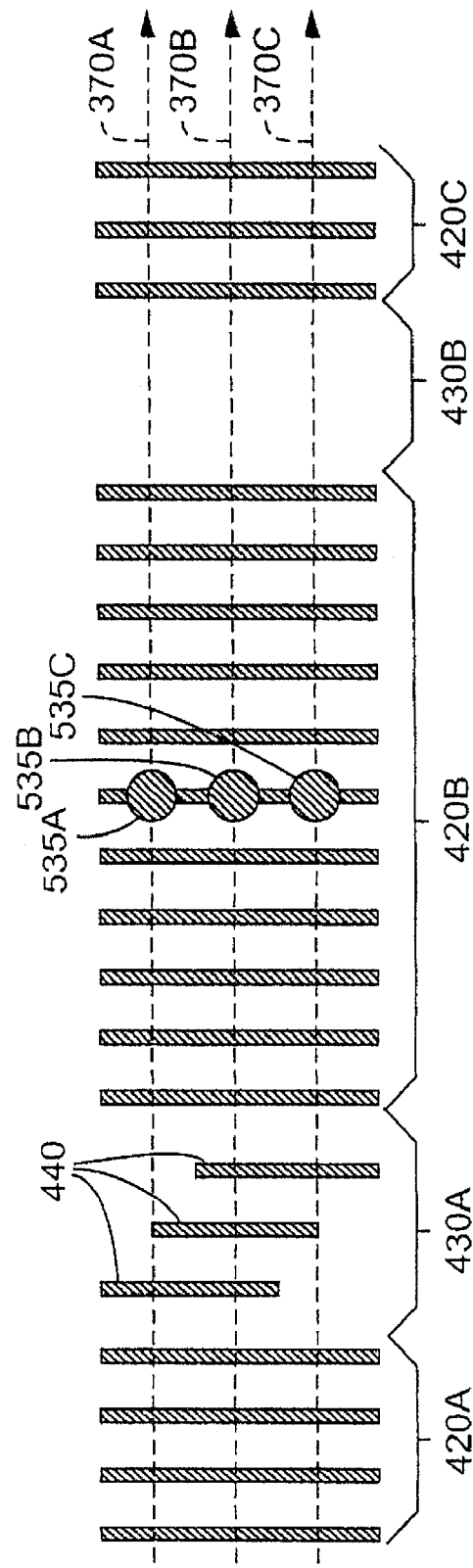

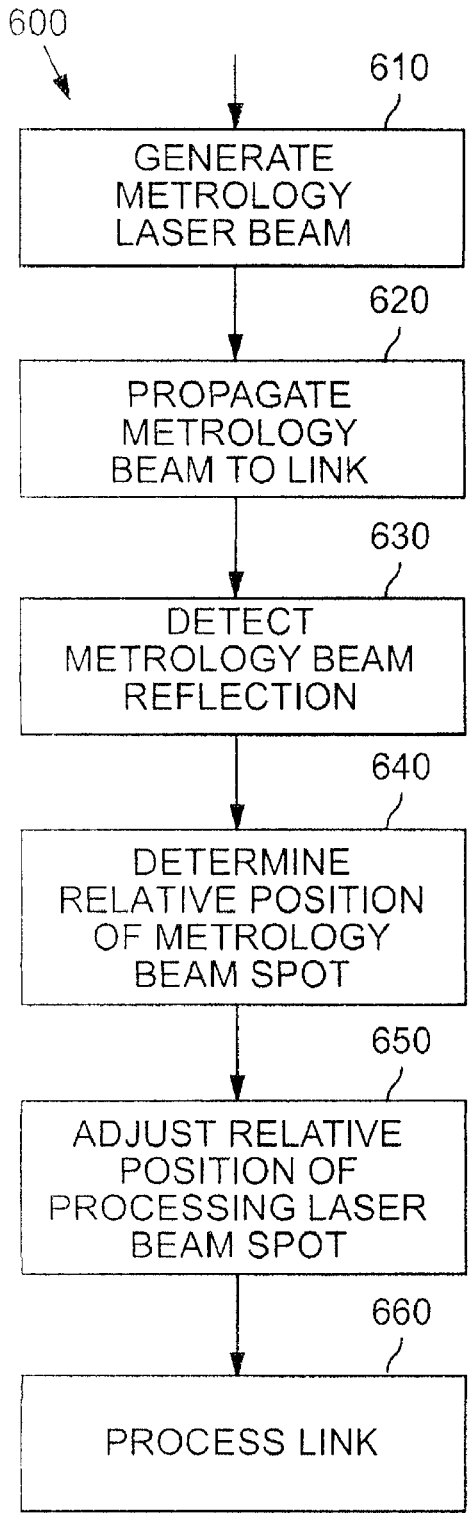
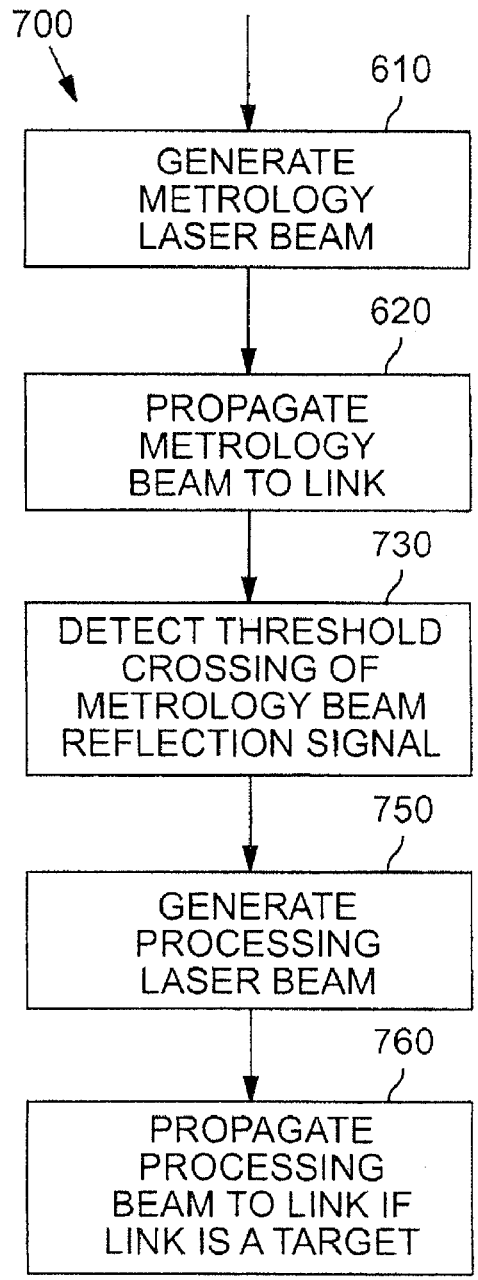
FIG. 14A
FIG. 14B

METHODS AND SYSTEMS FOR POSITIONING A LASER BEAM SPOT RELATIVE TO A SEMICONDUCTOR INTEGRATED CIRCUIT USING A PROCESSING TARGET AS AN ALIGNMENT TARGET

TECHNICAL FIELD

This disclosure relates generally to the use of a laser to process a semiconductor integrated circuit during its manufacturing, and more particularly to positioning of a laser beam spot on or within a semiconductor integrated circuit.

BACKGROUND

During their fabrication process, ICs (integrated circuits) often incur defects due to minor imperfections in the process or in the semiconductor material. For that reason, ICs are usually designed to contain redundant circuit elements, such as spare rows and columns of memory cells in semiconductor memory devices, e.g., a DRAM (dynamic random access memory), an SRAM (static random access memory), or an embedded memory. Such devices are also designed to include laser-severable links between electrical contacts of the redundant circuit elements. Such links can be removed, for example, to disconnect a defective memory cell and to substitute a replacement redundant cell. Similar techniques are also used to sever links in order to program or configure logic products, such as gate arrays or ASICs (application-specific integrated circuits). After an IC has been fabricated, its circuit elements are tested for defects, and the locations of defects may be recorded in a data file or defect map. A laser-based link processing system can be employed to remove selected links so as to make the IC useful, provided positional information regarding the layout of the IC and the location of its circuit elements are known with sufficient accuracy.

SUMMARY

According to one embodiment, a method positions a laser beam spot relative to a semiconductor substrate having structures on or within the semiconductor substrate to be selectively processed by delivering a processing laser beam to a processing laser beam spot. The method generates a metrology laser beam and propagates the metrology laser beam along a propagation path to a metrology laser beam spot on or near a structure to be selectively processed. The method detects a reflection of the metrology laser beam from the structure, thereby generating a reflection signal, while the angular velocity of the semiconductor substrate about its approximate center is no more than negligible. The method determines, based on the reflection signal, a position of the metrology laser beam spot relative to the structure.

According to another embodiment, a system positions a laser beam spot relative to a semiconductor substrate having structures on or within the semiconductor substrate to be selectively processed by delivering a processing laser beam to a processing laser beam spot. The system comprises a laser, a propagation path, a sensor, and a controller. The laser produces a metrology laser beam. The propagation path extends from the laser to a metrology laser beam spot on or near a structure to be selectively processed. The sensor is positioned to detect a reflection of the metrology laser beam from the structure, thereby generating a reflection signal, while the ananlar velocity of the semiconductor substrate about its approximate center is no more than negligible. The controller, which is connected to the sensor, is configured to determine, based on the reflection signal, a position of the metrology laser beam spot relative to the structure.

According to yet another embodiment, a method positions the delivery of a laser beam to a structure on or within a semiconductor substrate. The method generates a metrology laser beam having a metrology laser beam spot that intersects the substrate and propagates the metrology laser beam along a propagation path to the metrology laser beam spot on or near the structure to be selectively processed. The method detects a reflection of the metrology laser beam from the structure, thereby generating a reflection signal and detects when the reflection signal crosses a threshold. Responsive to said detecting step, the method generates the processing laser beam and propagates the processing laser beam to the structure where the reflection of the metrology beam was detected.

Details concerning the construction and operation of particular embodiments are set forth in the following sections with reference to the below-listed drawings.

BRIEF DESCRIPTION OF THE DRAWINGS

FIG. 7 is an illustration of a segment of a link run across a number of link banks with a processing laser beam spot.

FIG. 8 is an illustration of a segment of a link run across a number of link banks with an alignment laser beam spot.

FIG. 9A is an illustration of a segment of a link run across a number of link banks with both a processing laser beam spot and an alignment laser beam spot.

FIG. 9B is an illustration of a multiple laterally spaced metrology link runs across a segment including laterally offset partial link-like structures for lateral alignment.

FIGS. 14A and 14B are flowcharts of methods according to two embodiments.

The drawings are meant to facilitate understanding of the principles described herein. As such, the drawings are not meant to depict scale or relative size accurately.

DETAILED DESCRIPTION OF EMBODIMENTS

With reference to the above-listed drawings, this section describes particular embodiments and their detailed construction and operation. As one skilled in the art will appreciate, certain embodiments may be capable of achieving certain advantages over the known prior art, including some or all of the following: (1) greater positional accuracy delivering laser radiation to a selected structure; (2) less reliance on dedicated alignment targets; (3) more robust and less sensitive alignment, and (4) simultaneous determination of both focus depth alignment and on-axis alignment. These and other advantages of various embodiments will be apparent upon reading the following.

Figure 1:
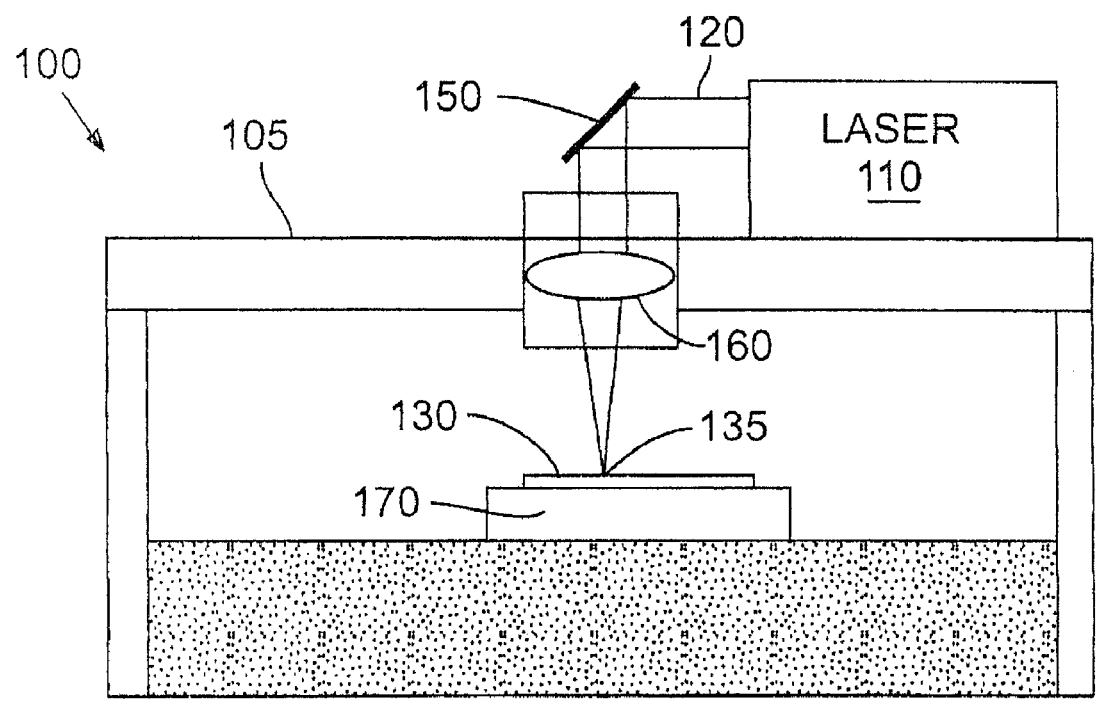
FIG. 1 is a simplified diagram of a link processing system.

FIG. 1 illustrates a typical link processing system 100. The system 100 comprises a laser 110, which produces a laser beam 120. The laser beam 120 propagates along a propagation path until it reaches a workpiece 130, which is typically a semiconductor wafer, at a laser beam spot 135. Disposed along the propagation path may be a number of optics elements, including a mirror 150 and a focusing lens 160. The position of the laser beam spot 135 on the workpiece 130 can be varied by moving the workpiece 130 in an XY plane (the laser beam 120 being incident upon the workpiece 130 in the Z direction) underneath a stationary optics table 105, which supports the laser 110, the mirror 150, the focusing lens 160, and possibly other optical hardware. The workpiece 130 can be moved underneath in the XY plane by placing it on a chuck (not shown) that is carried by a motion stage 170.

Figure 2:
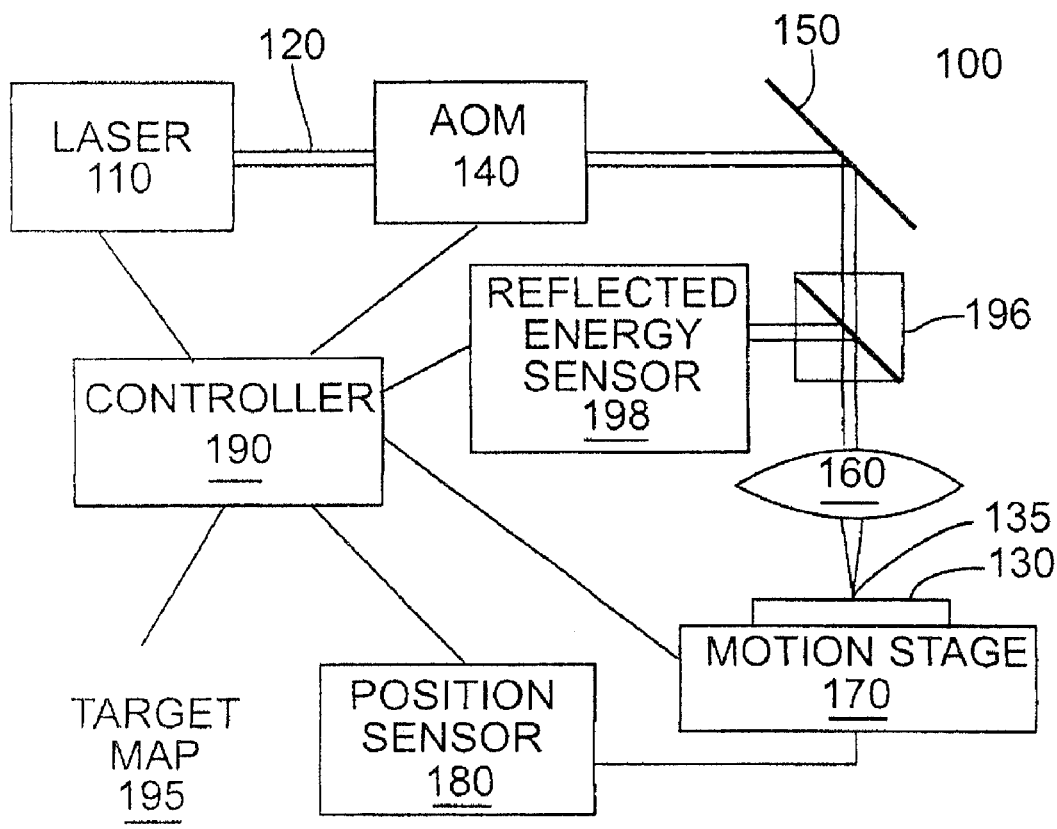
FIG. 2 is a block diagram of the link processing system of FIG. 1.

FIG. 2 is a block diagram of the link processing system 100. Along the propagation path of the laser beam 120 between the laser 110 and the workpiece 130 may be a number of optics elements, including an acoustic-optical modulator (AOM) 140, the mirror 150, and the focusing lens 160. The AOM 140 is responsive to a radio frequency (RF) input, which changes the direction in which the laser beam 120 exits the AOM 140. By selectively driving the AOM 140 with an RF signal having an appropriate amplitude, the AOM 140 can be configured to selectively block or pass the laser beam 120 to the mirror 150, through the lens 160, and onto the workpiece 130. In other words, the AOM 140 behaves like a light switch or shutter in the laser beam propagation path. It is additionally possible to use the AOM 140 in a partially transmitting state by driving the AOM 140 with RF power of reduced amplitude. This mode is useful for attenuating, but not completely blocking, the laser emissions that propagate along the laser beam propagation path.

Any device capable of functioning as a light switch or shutter can be used in place of the AOM 140. An electro-optic-modulator (EOM) and a liquid crystal modulator are examples of some such alternative devices.

A position sensor 180 senses where the workpiece 130 is relative to the laser beam spot 135 and reports that position data to a controller 190 (which may be one or more computers, processors, circuits, etc.). The controller 190 accesses a target map 195, which contains data indicating target positions on the workpiece 130 that should be irradiated (e.g., to sever a link at that position). The target map 195 is typically generated, for example, from a testing process that determines which circuit elements in the workpiece 130 are defective, logic that determines which links to process to disconnect defective elements and swap in redundant elements, and CAD (computer-aided design) data or other data indicating the positions of the links to be processed. The controller 190 typically choreographs the pulsing of the laser 110, the shuttering of the AOM 140, and the moving of the motion stage 170 so that the laser beam spot 135 traverses over each target and emits a laser pulse that reaches the workpiece 130 at the targets. The controller 190 preferably controls the system 100 based on position data, as that approach provides very accurate placement of link blows. U.S. Pat. No. 6,172,325, assigned to the assignee of the present invention and incorporated in its entirety herein by reference, describes laser-pulse-on-position technology.

As used herein, the phrase "laser beam spot" is actually a shorthand expression for the spot at which the axis of the laser beam's propagation path intersects the workpiece 130. To be precise, a laser beam is on sometimes and off sometimes. For example, the AOM 140 can block the laser beam 120 from reaching the workpiece 130. As another example, a pulsed laser beam is periodically on and off. Even when the laser beam is off, however, the spot at which the axis of the laser beam's propagation path intersects the workpiece 130 is always present and moves along the surface of the workpiece 130 as the motion stage 170 moves.

FIG. 2 also depicts a beam splitter 196 and a reflected energy sensor 198, which can be used during an alignment mode to collect reflected energy from the workpiece 130 and to measure that energy. In a typical X or Y alignment scan (sometimes referred to as beam-to-work (BTW) scans), the laser beam spot 135 is scanned across an alignment feature on the workpiece 130. The reflection off the workpiece 130 passes through the beam splitter 196 to the reflected energy sensor 198, which conveys its readings to the controller 190. The reflected energy readings correspond to numerous position coordinates from the position sensor 180 or from position commands sent to the motion stage 170. Differences in the received reflected power when the laser spot falls upon the alignment feature, and the area surrounding the alignment feature, are interpreted by the controller 190, along with the position coordinates, to deduce the location of the alignment feature in the coordinate system of the position sensor 180 or the motion stage 170. Typically, the alignment feature is more highly reflective than the area surrounding the alignment feature, resulting in increased optical power received by the reflected energy sensor 198 when the laser beam spot 135 overlaps with the alignment feature. Comparison of the feature location determined through the alignment scan process with reference positional data indicating the target location (e.g., the target map 195 or CAD data) can be used to calibrate the location, scale, rotation and/or higher order (i.e., three dimensional) calibration terms concerning the location of the workpiece 130 or the target in the coordinate system of the laser processing system 100. As used herein, the term "alignment" encompasses X or Y alignment (or both), Z depth focusing, and all other types of positional or spatial calibration.

Note that it is immaterial whether the laser 110 and its associated optics are stationary and the workpiece 130 moves, or vice versa, or some combination of movement by both bodies occurs. All that is required is the laser beam spot 135 and the workpiece 130 move relative to one another. For example, as one alternative to what is shown in FIGS. 1 and 2, the position of the laser beam spot 135 can be varied over the workpiece 130 by holding the workpiece 130 still while moving the optics hardware on the optics table 105. As another alternative, both the optics hardware and the workpiece 130 can be moved to provide relative motion between the laser beam spot 135 and the workpiece 130. As yet another alternative, the optics table 105 and the workpiece 130 may be still, while steering mirrors are used to move the laser beam spot 135 along the workpiece 130.

Note also that the purpose of the laser irradiation could be anything, not just link blowing. The purpose of the irradiation may be to drill, machine, trim, sever, cleave, make, heat, alter, diffuse, anneal, or measure a structure or its material. For example, laser radiation can induce a state change in a structure's material, cause the migration of dopants, or alter magnetic properties—any of which could be used to connect, disconnect, tune, modify, or repair electrical circuitry or other structures.

Figure 3:
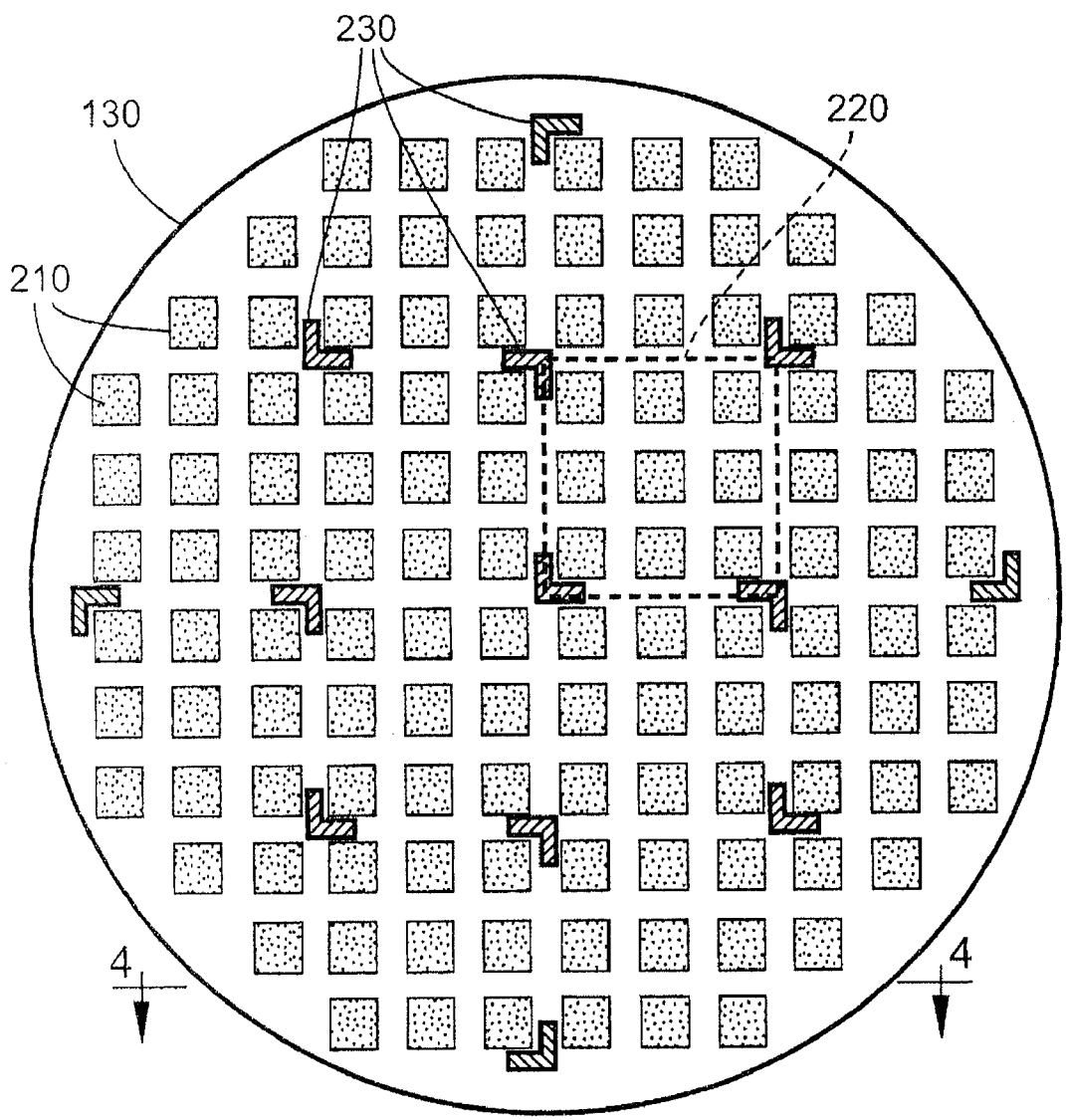
FIG. 3 is top view of a semiconductor wafer.

FIG. 3 is a top view of a semiconductor wafer, which is the most typical form of the workpiece 130. This workpiece 130 contains a number of dies 210, which are generally laid out in a regular geometric arrangement. A group of contiguous dies in a typically rectangular pattern constitutes an alignment region 220, at or near the corners of which are dedicated alignment targets 230. There may be additional alignment targets (not shown) on or near each die. As mentioned above, the alignment targets 230 can be used to align the laser beam spot 135 to the workpiece 130. Alignment data gathered from the alignment targets 230 in each corner of an alignment region 220 can be used to calculate the positions of links to be processed within each die in the alignment region. For example, surface fitting algorithms can be applied to the known corner alignment target data to fit a surface model to the alignment region. This process is commonly referred to as position geometry correction (PGC). While such techniques are useful, they are also suffer from the following fundamental limitations: (1) the dedicated alignment targets are limited in number and (2) the alignment targets are at best indirect indicators of the positions of the links in the interior of the alignment region 220. For example, a dust particle underneath the alignment region 220 may cause the workpiece 130 to deflect in a way that alters the Z heights of certain interior links but does not alter the Z heights of the alignment targets.

Figure 4:
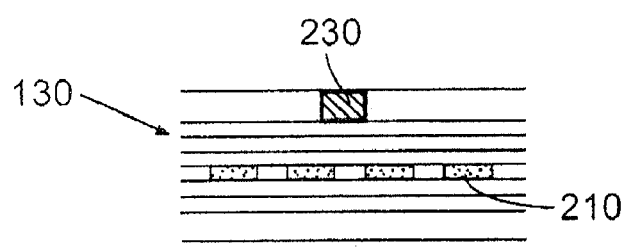
FIG. 4 is a side view of the semiconductor wafer of FIG. 3.

FIG. 4 is a side view of the same workpiece 130. FIG. 4 illustrates the fact that the alignment targets 230 may be, and in fact typically are, on a different layer of the workpiece 130 and therefore at a different Z height from the links in the dies 210. This Z offset can complicate alignment in the Z dimension (i.e., focusing). Either the offset must be accounted for or some misalignment in the Z direction must be tolerated.

Figures 5A, 5B, 5C:
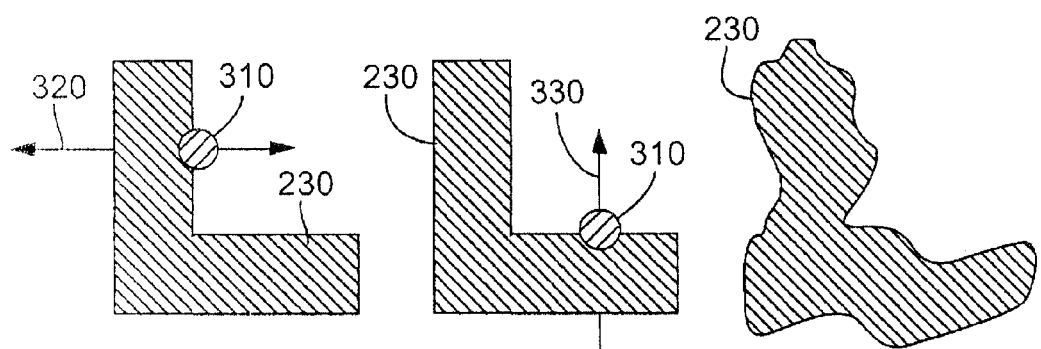
FIGS. 5A and 5B are illustrations of alignment operations using dedicated alignment targets.
FIG. 5C is an illustration of a malformed dedicated alignment target.

FIGS. 5A and 5B are illustrations of alignment operations using a dedicated alignment target 230. In FIG. 5A, an alignment laser beam spot 310 traverses back and forth across the alignment target 230 in an X alignment path 320. The beam spot 310 traverses this path 320 at a number of different focusing heights, and the focusing height producing the sharpest edge transitions is used to register the edge positions of the alignment target 320. In FIG. 5B, the same process is repeated in the Y direction along a Y alignment path 330. When the alignment target 320 is malformed, however, as shown in exaggerated form in FIG. 5C, then the position data produced from scanning the alignment target 220 may be flawed.

Figure 6:
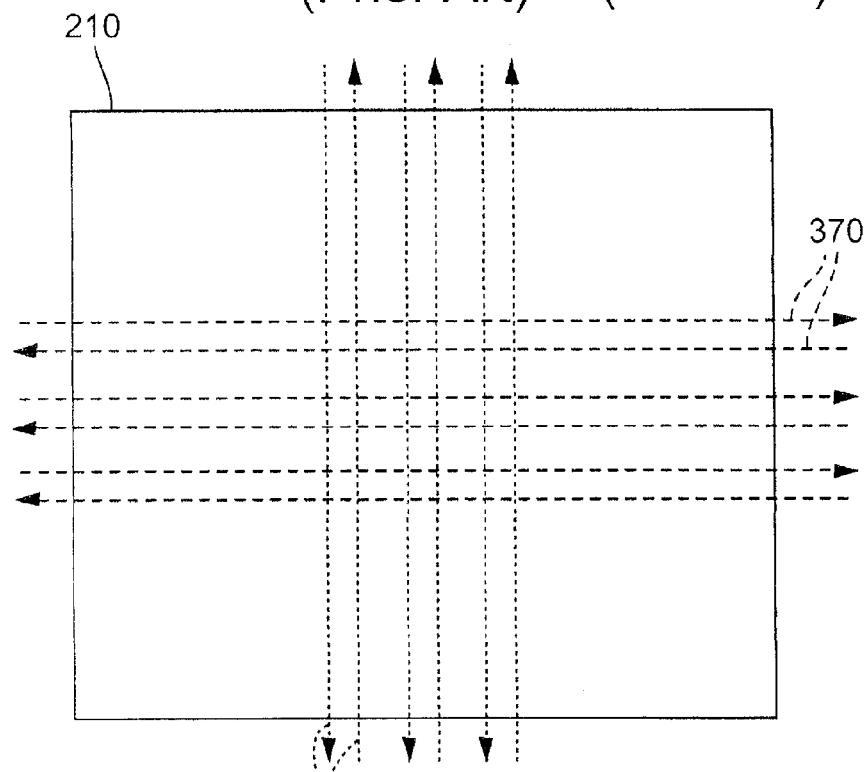
FIG. 6 is an illustration of link runs across a semiconductor die.

FIG. 6 is an illustration of link runs across a semiconductor die 210. Both X direction link runs (along the X direction trajectories 370) and Y direction link runs (along the Y direction trajectories 380) are shown. Circuit elements within a given die (which are typically all the same on a given wafer) are typically arranged in a regular geometric arrangement, as are the links between those elements. The links usually lie in regular rows in groups which are termed "link banks," having an approximately uniform center-to-center pitch spacing. To remove selected links in a link bank, the beam spot 135 continuously advances along the link bank at an approximately uniform speed while the laser 110 emits pulses to selectively remove links. The laser 110 is triggered to emit a pulse and thereby to sever a link at a selected target position when the laser beam spot is on the target position. As a result, some of the links are not irradiated and left as unprocessed links, while others are irradiated to become severed or otherwise physically altered. The process of progressing across some or all of the workpiece 130 and processing selected links with laser radiation is termed a "link run."

FIG. 7 is a more detailed illustration of a segment of a link run along a link run trajectory 370 across a number of link banks 420. Each link bank 420 consists of a number of more-or-less regularly spaced links 410. Gaps 430 may exist between link banks 420, as shown. As the laser beam spot 135 moves along the link row during the link run, the laser beam is selectively turned on to reach the workpiece 130 and thereby sever or otherwise alter selected links in accordance with a processing plan (e.g., memory defect repair plan to disconnect defective memory cells and connect or leave connected redundant ones in their place). For example, as shown in FIG. 7, the second and third links in the link bank 420B have been severed, while the first, fourth, and fifth links have been left intact.

Accurate processing of the links 410 depends upon accurate positioning of the laser beam spot 135 on the links 410 at the appropriate time when a laser pulse is delivered by the laser 110. Positional and focusing accuracy is becoming increasingly important as the required tolerances for focus and position continue to shrink on semiconductors due to smaller focused spot sizes, smaller links, and tighter link pitches.

The present inventor has realized that positioning can be improved by using the links 410 themselves as alignment targets in place of or in addition to the dedicated alignment targets 230. One version of this approach is illustrated in FIG. 8, which shows an alignment laser beam spot 535 traversing a link run alone the link run trajectory 370. As the alignment laser beam spot 535 moves over and between the links 410, the reflection pattern is measured and can be used to perform alignment, at least in the X direction of the link run 370 and/or in the Z direction. A similar operation can be performed along a Y direction link run 380 to perform alignment in that direction as well. By this method both on-axis and cross-axis positions may be determined. It may also be useful to perform an alignment scan of links in a row run in one direction, then perform an alignment run of the same bank(s) of links in the opposite direction. Opposing scans may be able to further refine the calibration or identify directional dependencies in the alignment data.

One way to use the metrology data gathered from the links 410 is to use it to update mathematical models of alignment and focus. For example, data gathered from alignment scans can be used to update PGC models of alignment and focus fields. Alternative mathematical models are also possible. Iterative or recursive refinement of the models based upon some new data and some older data are also useful techniques. Once models have been generated, link coordinates can be mapped using the models as a way to properly process link coordinates. Alternatively, if focus and lateral calibration data are scanned off link banks with a small enough pitch, then mathematical models may be unnecessary, as one can just utilize the XY offsets or Z heights of the nearest scan. This technique can be applied by scanning every link and link bank for calibration information. It can also be applied by scanning some links and link banks so that data exists near every link, for example within 1-2 mm laterally of each link location.

The alignment laser beam spot 535 may be the same as the processing laser beam spot 135, as the same laser can be used for both alignment and processing. One technique for doing so is to operate the laser 110 in a continuous wave (CW) mode during an alignment link run and to operate the laser 110 in a pulsed mode during a processing link run. According to that technique, alignment link runs can be interspersed with processing link runs as desired to collect alignment data. It may even be possible to switch laser modes between alignment and processing modes during the same link run. Alternatively, two distinct laser beams may have the same or substantially overlapping laser beam spots, one of which may be used for metrology and the other for processing.

Alternatively, some versions of the laser 110 (e.g., fiber lasers) may be made to leak a small amount of CW energy for alignment while operating predominantly in a pulsed mode for processing. The low-energy CW beam may have one or more optical characteristics (e.g., polarization) to differentiate its reflection from that of the pulsed processing laser beam. In other cases, the optical characteristics may be unchanged, letting the system 100 tolerate occasional erroneous alignment reads caused by processing of a link. By averaging over a sufficient number of links, those occasional erroneous alignment reads become insignificant. Alternatively, known bad alignment reads can be simply ignored. An alignment read may be known to be bad due to (1) measurement of a much higher than usual reflection (caused by the processing laser beam reflecting off the link) or (2) knowledge that a particular link is targeted to be processed.

Yet another alternative technique for producing an alignment laser beam from the same laser used for link processing is the rapid pulsing technique described in U.S. patent application Ser. No. 10/931,460. According to that technique, the Q switch of a Q-switched laser is alternately opened and closed at a rapid rate so that the laser emits more rapid, less energetic pulses than normal pulsed mode operation. If the pulse rate is sufficiently high, less laser energy reaches the workpiece 130 so that alignment can occur without damage to the workpiece 130. Pulsed BTW alignment typically involves synchronizing reads of reflectivity data with the generation of the pulses.

Another embodiment, the alignment laser beam spot 535 and the processing laser beam spot 135 may be distinct and separate, as shown in one illustrative arrangement in FIG. 8. If the offset between the alignment laser beam spot 535 and the processing laser beam spot 135 (not shown in FIG. 8) is known, that offset can be taken into account when positioning the processing laser beam spot 135 for operation. This may be the case, for example, when the two beams, although produced from the same laser, have different or divergent propagation paths, perhaps do to optical processing differences. This can also occur when two or more lasers are employed to produce one or more alignment beams and one or more processing beam simultaneously. Methods and systems for producing multiple laser beam spots are disclosed in U.S. patent applications Ser. Nos. 11/051,265, 11/051,262, 11/052,014, 11/051,500, 11/052,000, 11/051,263, 11/051,958, and 11/051,261, which are incorporated herein by reference. Those applications teach techniques for using multiple laser beam spots to process multiple links in various parallel configurations, including "on-axis" (in which the spots are distributed in the direction of the link run), "cross-axis" or "lateral" (in which the spots are distributed in the direction perpendicular to the link run) and hybrids. The same arrangements of beam spots can be utilized with one or more of the beam spots being alignment beam spots.

FIG. 9A shows one desirable on-axis arrangement in which the leading beam spot is the alignment beam spot 535 and the trailing beam spot is the processing beam spot 135. One or more additional trailing processing and/or metrology beam spots (not shown) may also be used. As this row of links is processed, alignment measurements are gathered from the alignment laser beam spot 535 and the measured data is processed to determine a precise location for the following processing laser beam spot 135 to process that link.

FIG. 9A shows one desirable on-axis arrangement in which the leading beam spot is the alignment beam spot 535 and the trailing beam spot is the processing beam spot 135. One or more additional trailing processing and/or metrology beam spots (not shown) may also be used. As this link run 370 is processed, alignment measurements are gathered from the alignment laser beam spot 535 and processed to determine a precise location for the following processing laser beam spot 135 to process that link.

Performing alignment using the links 410 can be more accurate than utilizing the dedicated alignment targets 230 alone for several reasons, including (1) decreased sensitivity to flaws in the dedicated alignment targets 230, (2) closer spatial correlation between the alignment targets and the processing targets, and (3) the ability to average over a large number of alignment measurements collected quickly. The following paragraphs elaborate upon those advantages.

First of all, the dedicated alignment targets 230 are typically quite sparse on the workpiece 130. If a dedicated alignment target 230 is defective (as shown in FIG. 5C), one must travel a relatively long distance to find an alternative dedicated alignment target that may be satisfactory. Also, there may not be a dedicated alignment target near to all of the links 410 that need to be processed, so guesswork about the XY alignment and focus height must occur. Fine features, such as vertical displacements that occur due to a particle under the wafer, may also be missed.

Secondly, it is fundamentally not as accurate to scan at the corners of alignment region 220 and then make inferences about the interior of the region 220 using mathematical models. The links 410 are the closest optical targets at or nearby the location of the links to be processed. On a related note, focusing on the links 410 is also more accurate than bouncing a beam off the surface of the workpiece 130 for focus height determination due to variations in the thicknesses of the intervening layers.

Third, scanning a row of many links 410 allows quick data capture of multiple targets, averaging of many target locations, and a redundancy that eliminates problems due to defective targets. A great quantity of alignment data can be quickly captured off of a row of successive links. This fast data capture is possible because data can be recorded while the motion stage 170 moves continuously in one direction. It is impractical to place many alignment targets in a row in the interior of a die because of the extremely valuable workpiece area they would occupy. Therefore, using the naturally occurring rows of links as alignment targets can enable fast data capture, and measuring the location of many links allows one to average the location of tens, hundreds, or even thousands of target locations together to get a position estimate. Furthermore, the problems caused by a defective dedicated alignment target 230 are mitigated using the links 410 as alignment targets. A defective dedicated alignment target 230 may be incapable of providing an accurate reference signal, regardless of how many times it is scanned. In contrast, if the locations of many different links 410 are assessed and averaged, the impact of a single defective target is minimal.

FIG. 9B is an illustration of a multiple laterally spaced metrology link runs 370A, 370B, and 370C across a segment of links including laterally offset partial link-like structures 440. The laterally offset partial link like structures 440 may be placed in a gap, such as the gap 430 as shown. Scanning laterally offset metrology beam spots across the structure 440 (either scanning with the same beam serially with a progressive lateral offset for each scan, or scanning with multiple beams in parallel as shown) provides cross-axis alignment information. For example, the middle beam spot 535B produces a reflection off all three structures 440, while the top beam spot 535A produces a full reflection off only the first (leftmost) structure 440, and the bottom beam spot 535C produces a full reflection off only the third (rightmost) structure 440. Depending upon the arrangement of the structures 440, the number, order, and/or timing of the reflections off the structures 440 conveys information about the lateral position of the metrology beam spot. More or less structures 440 can be utilized; the number and arrangement of structures 440 in FIG. 9B is merely illustrates the concept. If the metrology beam is steerable in the Y (cross-axis) direction, dithering the Y position of the beam spot during a single link run can also produce Y alignment information.

Other arrangements of multiple metrology laser beam spots are possible, such as for example, multiple on-axis spots, multiple cross-axis spots on separate generally parallel link runs, cross-axis offset within the same link run as shown in one illustrative form in FIG. 9B, and hybrids of some or all of the above.

Figure 10:
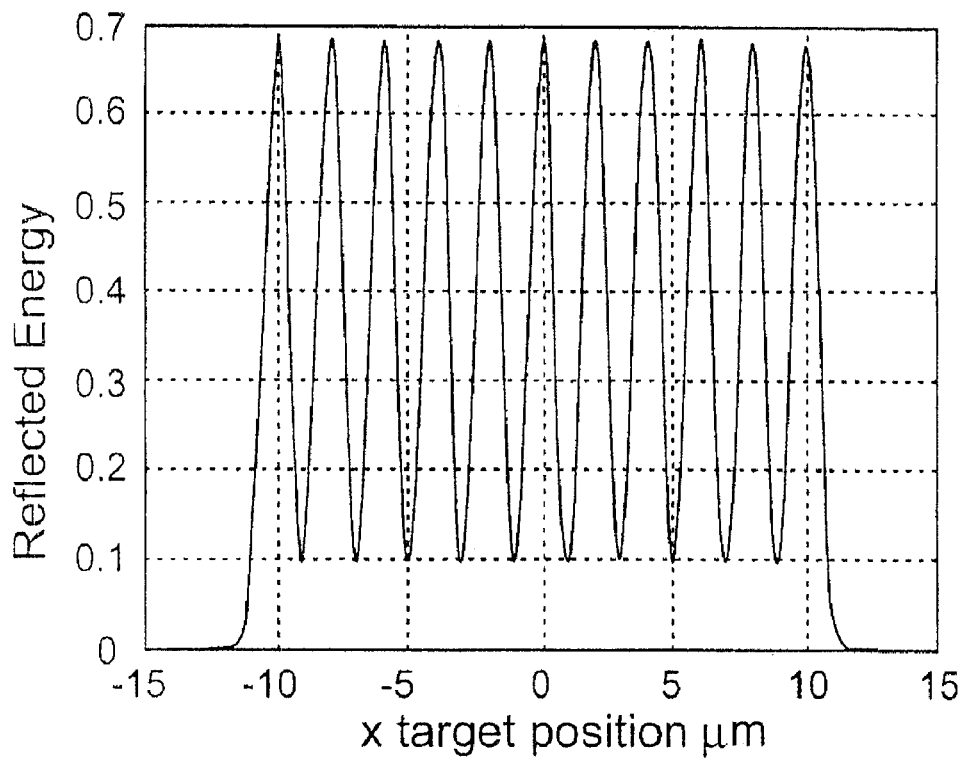
FIG. 10 is a graph of reflected alignment laser energy as a function of X position across the middle link bank of FIG. 8 or 9.

FIG. 10 is a graph of reflected alignment laser energy as a function of X position across the middle link bank 420B of FIG. 8 or 9. FIGS. 10-13 were produced by simulation assuming that the links 410 in this bank 420B have a uniform width of 0.75 microns (μm or $10^{-6}$ meters) and a uniform pitch of 2 microns and that the beam spot has a Gaussian distribution with a $1/e^2$ diameter of 1.5 microns.

A single swipe of the alignment laser beam spot 535 down the link bank 420B can quickly and efficiently gather a set of position and reflection measurements that can be used for alignment. This reflection data can be used to determine the on-axis relationship between the beam waist and the target links 410. FIG. 10 shows that there are actually 11 maxima and 10 minima in the reflection signal. Maxima can be used to locate links; minima can be used to locate the center of the spaces between links (average location of two adjacent links). Thus, the application of a peak finding algorithm to this reflection signal and CAD data of link coordinates can generate 21 estimates of laser-link alignment. Curve fitting to a reflectivity model, rather than using a peak finding algorithm, may provide greater accuracy.

Averaging the results of multiple located peaks can determine the spot-link alignment with better resolution than present measurements of one target for two reasons: First, the quick capture of serialized reflectivity signals allows the capture of many more reflection peaks than traditional repetitive scans of a single target in the same amount of time. Second, the impact of a defective link in the midst of a row of many perfect links can be reduced through averaging.

These methods are applicable to banks of links of any length. The links 410 may have uniform spacing and width, or may alternatively have a non-uniform spacing and/or a non-uniform width. These methods may be applied to multiple banks of links with gaps of even or varying sizes between the banks.

Figure 11:
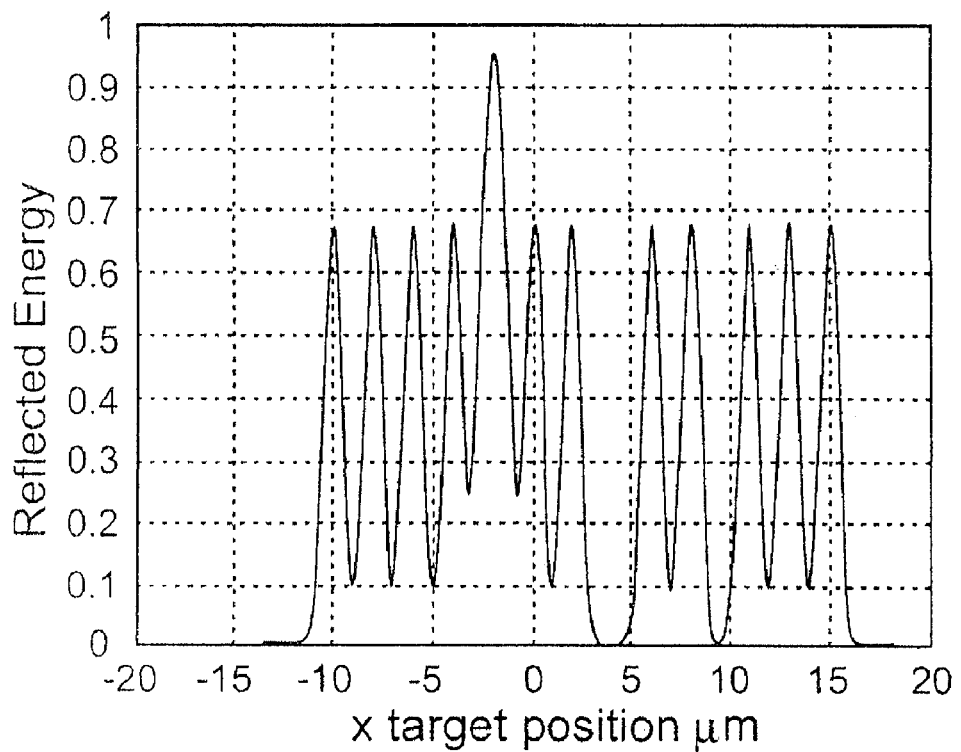
FIG. 11 is a graph of reflected alignment laser energy as a function of X position across a link bank having a correlation pattern.

In some cases it may be necessary to correlate the reflection produced by a link with the CAD location for the correct link in order to calibrate. For example, reflection data out of the center of a very long string of identical links with identical spacing may not indicate which link produced which reflection. Thus calibration may be off by integer multiples of the link spacing. Synching techniques can be employed to definitively overlap reflection data and CAD models. For example, a known pattern, such as a Barker code, may be provided on the die to produce a unique and easily identified patterning in the links. This may include a known number of links, with a known space, followed by a known number of links. Alternatively, a pattern in the link pitch and/or link width can be used for synchronization. As one example, FIG. 11 shows a graph of reflected alignment laser energy as a function of X position across a link bank having a correlation pattern. In this pattern, a wide link is located at a position of −2 microns, and there is a missing link at a position of +4 microns and a wider link spacing a position of +9 microns. Any or all of these can be used to insure that the correct link 410 is being correlated with the correct reflection signature.

In some cases it may be desirable to initially perform some alignment scans on the dedicated alignment targets 230 around the die perimeter in order to determine a preliminary model of link location. This can be done using machine vision techniques to initially find alignment targets, possibly followed by BTW scans of dedicated alignment targets 230 to refine the position estimate. This preliminary model of link location can then be refined by the methods described herein. If the preliminary model of link locations is sufficiently accurate to sub-link-pitch tolerances, then the synchronization step described above may not be necessary.

Figure 12A:
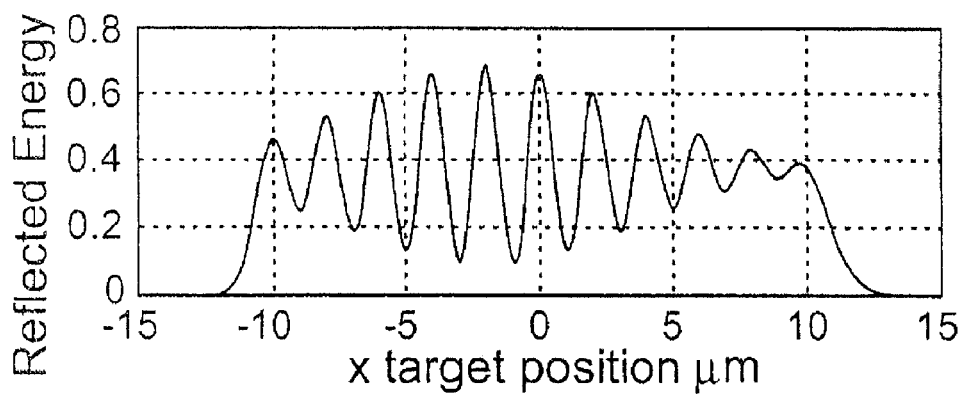
FIGS. 12A and 12B are graphs of reflected alignment laser energy as a function of X position and Z position, respectively, across the middle link bank of FIG. 8 or 9.
Figure 12B:
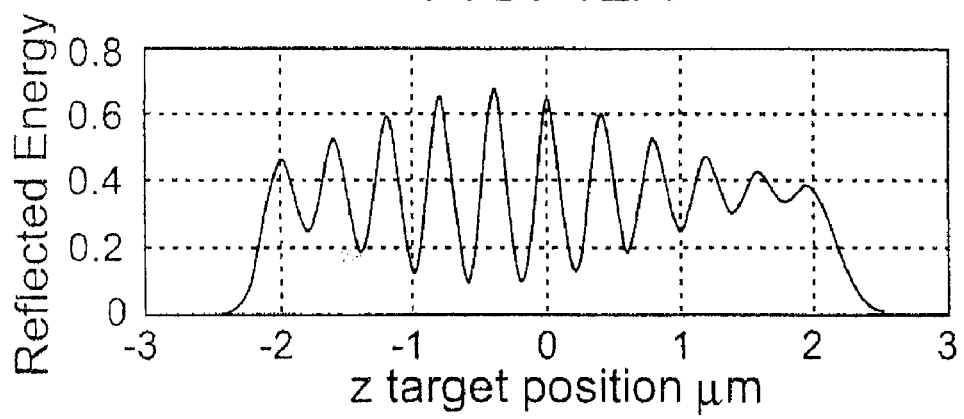

Slewing the Z height while traveling down a row of links can allow simultaneous on-axis position determination and focus height determination, as shown in FIGS. 12A and 12B, which are graphs of reflected alignment laser energy as a function of X position and Z position, respectively, across the middle link bank 420B of FIGS. 8 or 9. One way to assess focus is to change the Z height while traveling down the row of links and capturing reflectivity data. In FIG. 12, Z height is moved from −3 to +3 microns while X is simultaneously moved from −15 to +15 microns. The links and beam waist are co-planar at a Z height of −0.4 microns. FIG. 12B shows that the largest reflected energy, corresponding to the tightest spot size, occurs at a Z position of −0.4 microns. Examination of multiple peaks near focus can more accurately determine the best focus height, in particular when the focus height falls between two link positions. Interpolation, averaging, signal processing, curve fitting, and parameter estimation techniques can be used in this case. FIG. 12 demonstrates that it is possible to determine peak location simultaneously with focus. Therefore, on-axis and focus calibration can be performed simultaneously. This provides a quick way to calibrate two alignment variables.

Figure 13:
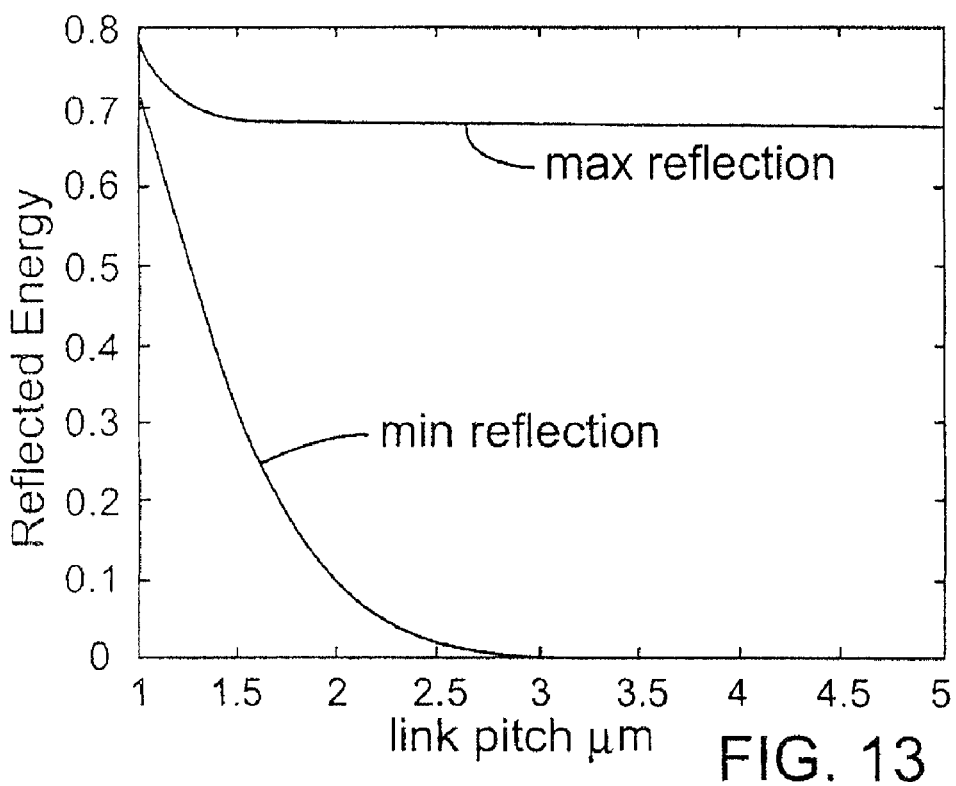
FIG. 13 is a graph of reflected alignment laser energy as a function of link pitch.

FIG. 13 is a graph of reflected alignment laser energy as a function of link pitch. The graph includes two curves—showing the maximum and minimum reflected energies, over a bank of links, as a function of link pitch. As the graphs show, if the link pitch is small in comparison with link width, there may be insufficient contrast between maximum and minimum reflected energy. Good contrast helps the peak finding process. Accordingly, spot size, link pitch, and link width all impact the reflection contrast. These parameters can be optimized to get high quality reflection data for superior calibration.

FIG. 14A is a flowchart of a method 600 according to one embodiment. The method 600 generates (610) a metrology laser beam and propagates (620) that laser beam towards a link 410 on the workpiece 130. The metrology laser beam intersects the workpiece 130 at an alignment laser beam spot 535, which at times passes over links 410. A reflection of the metrology laser beam is detected (630) and measured, resulting in a reflected energy signal, such as the one shown in FIG. 10, for example. On the basis of that reflection signal, the method 600 determines (640) the relative position of the alignment laser beam spot 535 relative to the particular links 410 over which the alignment laser beam spot 535 passes. The determining step 640 can be performed using any of the techniques described herein, including, for example, peak (which may be minima or maxima) finding algorithms, surface-fitting mathematical models, synchronization patterns formed by the links 410, and/or comparison with nominal position data such as CAD data. The method 600 then adjusts (650) the position of the processing laser beam spot 135, as necessary, so that the processing laser beam(s) is delivered to selected links more accurately in one or more of the X, Y, and Z dimensions for processing (660) of those selected links. The processing laser beam spot(s) 135 and the alignment laser beam spot 535 may substantially overlap or they may be separated from one another by a fixed or dynamically adjustable displacement. As already indicated, the steps of the method 600 can be performed sequentially or simultaneously to some degree, depending how the method 600 is implemented in a particular situation. The method 600 can be performed using a variety of different hardware configurations, including the ones illustrated in FIGS. 1 and 2, for example.

Figure 15:
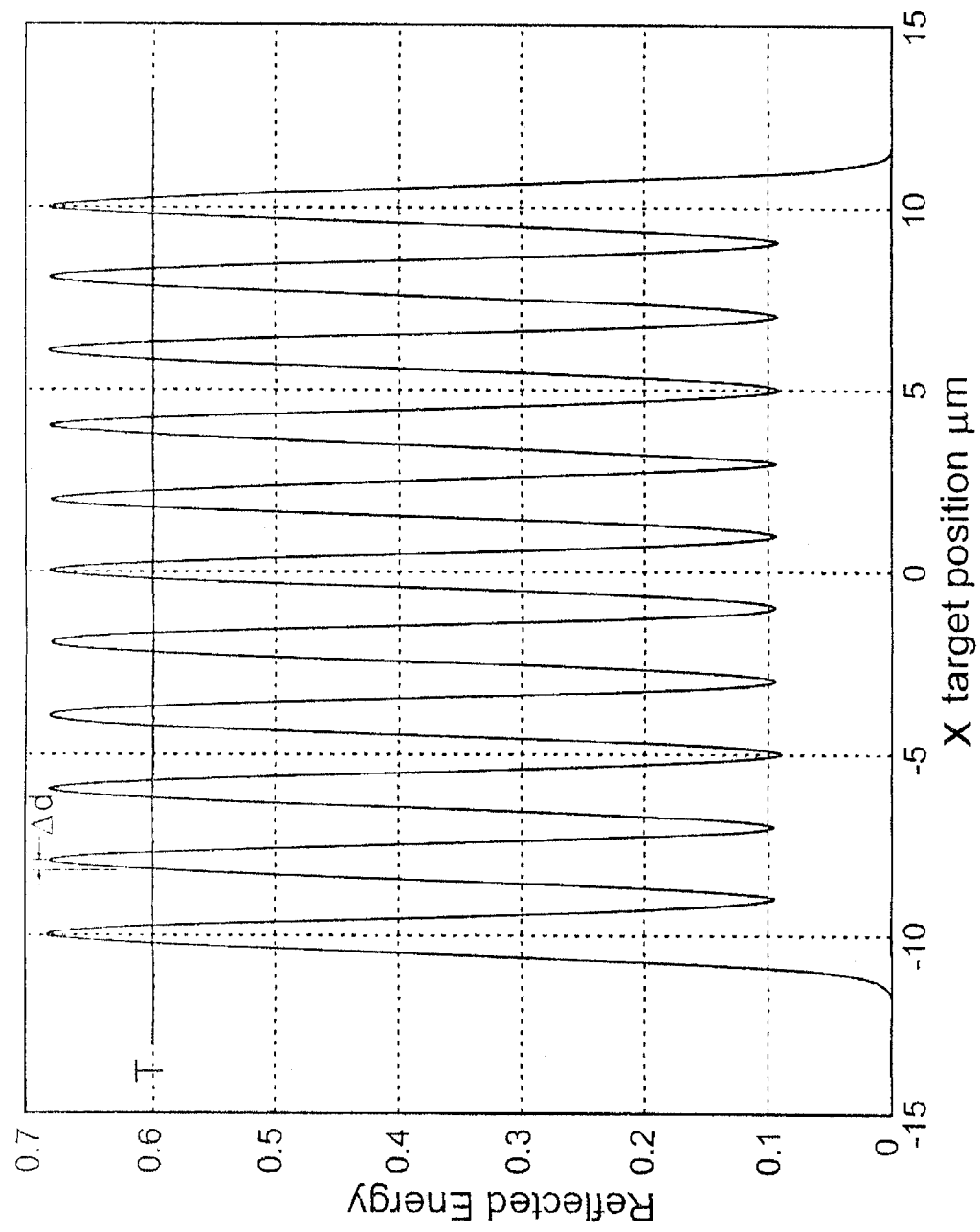
FIG. 15 is the graph of FIG. 10 with a threshold for use with the method of FIG. 14B.
Figure 1:
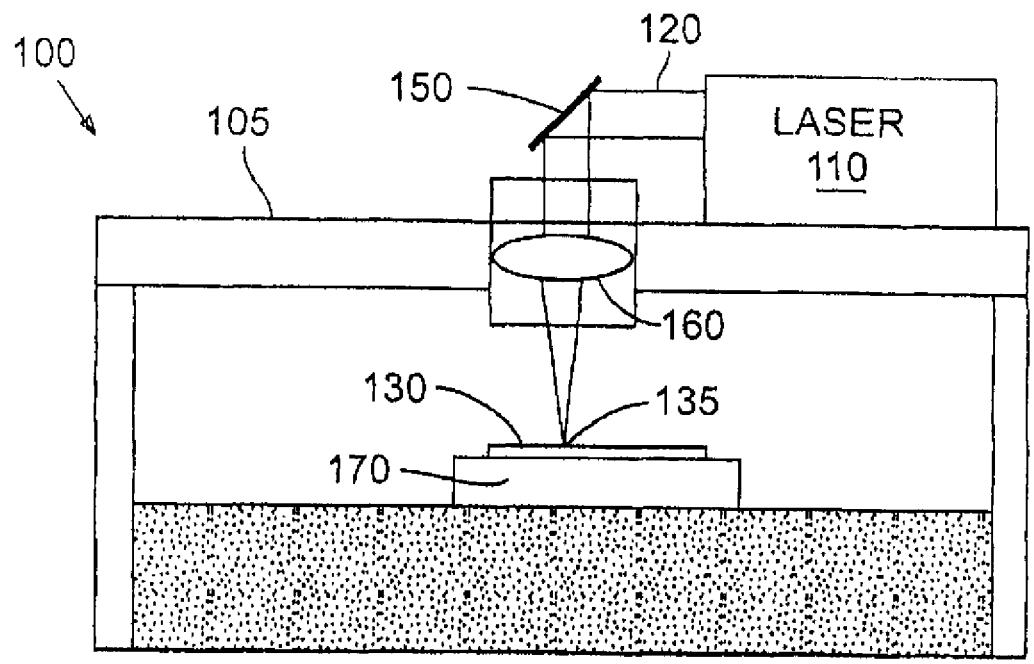
Figure 2:
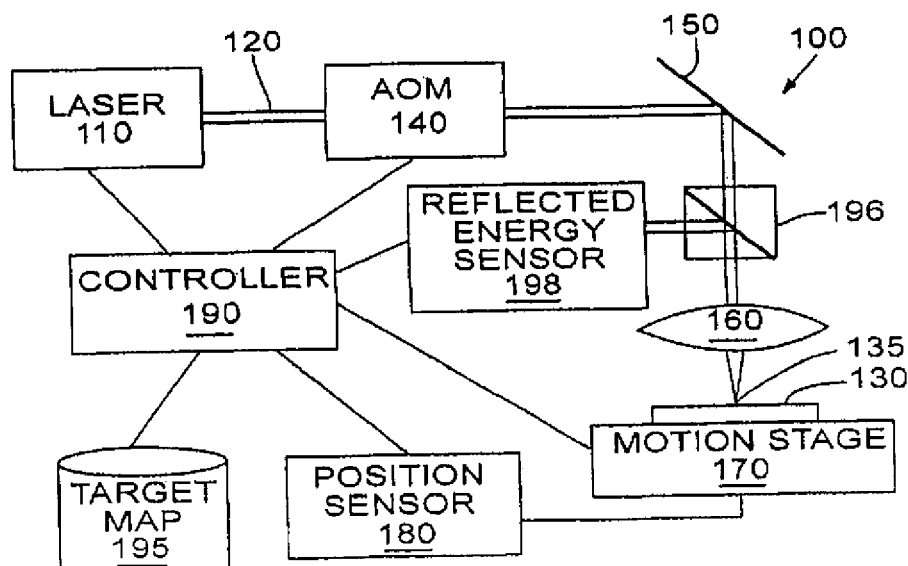

FIG. 14B is a flowchart of a "pulse-on-reflection" method 700 according to another embodiment. The method 700 is preferably utilized in a case, as illustrated in FIG. 9A, in which the metrology laser beam spot 535 leads the processing laser beam spot 135 through a link run. The method 700 generates (610) a metrology laser beam and propagates (620) that laser beam towards a link 410 on the workpiece 130. The reflection of the metrology laser beam spot 535 off the links 410 and intermediary material produces the reflection signal shown in FIG. 10 and reproduced in FIG. 15 as a function of X distance as the beam spot moves along the link run 370. FIG. 15 also shows a threshold T somewhat below the peaks in the detection signal. The method 700 detects (730) rising crossings of the reflection signal across the threshold T. These crossings indicate the positions of the centers of the links except for a small offset $\Delta d$. The method 700 generates (750) a processing laser beam and propagates (760) that laser beam to the position that produced the reflection peak as detected by the threshold crossing—i.e., to the link.

The method 700 preferably accounts for the delay involved in generating the laser pulse and propagating it to the workpiece 130 after a laser trigger command is issued. In the case in which the processing laser beam spot 135 lags behind the metrology laser beam spot 535, the method 700 can account for any additional time needed for the processing beam spot 135 to travel the distance between the processing beam spot 135 and the metrology beam spot 535 at the time of the threshold crossing detection. The timing of processing pulse delivery relative to the threshold crossing of the metrology reflection signal also preferably takes into account $\Delta d$, which is the offset from the threshold crossing and the link center. Ideally, the net result of any delay is that the processing laser beam spot 135 moves the proper distance along the workpiece 130 to precisely deliver its pulse to the target link. Alternatively, zero delay may be added between the detecting step 730 and the generating step 750. In fact, if $\Delta d$ is large, the processing laser beam spot 135 can lead ahead of the metrology laser beam spot 535.

The selection of an appropriate threshold T and delay time, if any, depends upon system variables such as the shape and magnitude of the reflection signal (which in turn depends on the optical properties of the metrology laser beam, the workpiece 130, and the parameters of the reflected energy sensor 198), the velocity at which link runs are performed, and the spacing (if any) between the metrology laser beam spot 535 and the processing laser beam spot 135. Those skilled in the art can select appropriate settings for a given scenario in light of the teachings herein.

The method 700 processes links where they are found and is to a large degree independent of any position model for the links. This pulse-on-reflection technique offers the advantage of immediacy in time between metrology sensing of a target's position and its processing. That immediacy can further enhance processing accuracy, as the opportunity for positional drift between the times of metrology and processing is reduced. An additional advantage of this pulse-on-reflection technique is that it can additionally compensate for residual errors in the calibration model, errors in the CAD link position database, or fabrication errors resulting in links that are slightly mislocated.

The algorithms for operating the methods and systems illustrated and described herein can exist in a variety of forms both active and inactive. For example, they can exist as one or more software programs comprised of program instructions in source code, object code, executable code or other formats. Any of the above can be embodied on a computer-readable medium, which include storage devices and signals, in compressed or uncompressed form. Exemplary computer-readable storage devices include conventional computer system RAM (random access memory), ROM (read only memory), EPROM (erasable, programmable ROM), EEPROM (electrically erasable, programmable ROM), flash memory and magnetic or optical disks or tapes. Exemplary computer-readable signals, whether modulated using a carrier or not, are signals that a computer system hosting or running a computer program can be configured to access, including signals downloaded through the Internet or other networks. Concrete examples of the foregoing include distribution of software on a CD ROM or via Internet download. In a sense, the Internet itself, as an abstract entity, is a computer-readable medium. The same is true of computer networks in general.

The terms and descriptions used herein are set forth by way of illustration only and are not meant as limitations. Those skilled in the art will recognize that many variations can be made to the details of the above-described embodiments without departing from the underlying principles of the invention. The scope of the invention should therefore be determined only by the following claims (and their equivalents) in which all terms are to be understood in their broadest reasonable sense unless otherwise indicated.

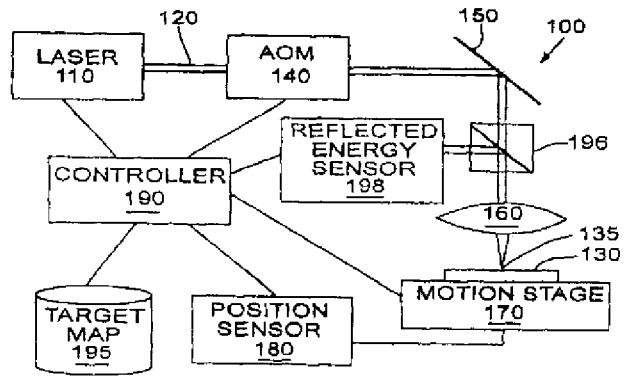

The invention claimed is:

1. A method for positioning a laser beam spot relative to a semiconductor substrate having structures on or within the semiconductor substrate to be selectively processed by delivering a processing laser beam to a processing laser beam spot, the method comprising:

generating a metrology laser beam, wherein the metrology laser beam is different from the processing laser beam;

propagating the metrology laser beam along a propagation path to a metrology laser beam spot on or near a structure to be selectively processed;

detecting a reflection of the metrology laser beam from the structure, thereby generating a reflection signal, while the angular velocity of the semiconductor substrate about its approximate center is no more than negligible; and determining, based on the reflection signal, a position of the metrology laser beam spot relative to the structure.

2. A method as set forth in claim 1, wherein the structures comprise electrically conductive links and irradiation of a link by the processing beam results in severing said link.

3. A method as set forth in claim 1, wherein the structures comprise potential electrically conductive links and the irradiation of a link by the processing beam results in making an electrical connection in said link.

4. A method as set forth in claim 1, further comprising:
generating the processing laser beam and propagating the processing laser beam to the structure where the reflection of the metrology beam was detected.

5. A method as set forth in claim 1, further comprising:
responsive to the determining step, adjusting the position of the processing laser beam spot relative to the structures.

6. A method as set forth in claim 1, wherein the processing laser beam spot and the metrology laser beam spot substantially overlap.

7. A method as set forth in claim 1, wherein the position of the processing laser beam spot is offset from the position of the metrology laser beam spot by a known displacement.

8. A method as set forth in claim 1, wherein said structure to be selectively irradiated is not actually irradiated by the processing laser beam.

9. A method as set forth in claim 1, wherein the measured position of the metrology laser beam spot relative to said structure to be selectively irradiated comprises a focusing depth component.

10. A method as set forth in claim 1, wherein the structures are arranged in a plurality of substantially parallel rows extending in a generally lengthwise direction, and the measured position of the metrology laser beam spot relative to said structure to be selectively irradiated comprises a component in the direction of the rows.

11. A method as set forth in claim 1, wherein the structures are arranged in a plurality of substantially parallel rows extending in a generally lengthwise direction, and the measured position of the metrology laser beam spot relative to said structure to be selectively irradiated comprises a component in a direction perpendicular to the direction of the rows.

12. A method as set forth in claim 1, wherein the structures are arranged in a plurality of substantially parallel rows extending in a generally lengthwise direction, and the method further comprises:
moving the metrology laser beam relative to the semiconductor substrate in a direction substantially parallel to the lengthwise direction of the rows, along one of said rows;
repeating the generating, propagating, and detecting steps as the metrology laser beam moves across links in said one of said rows;
wherein the reflection signal is a function of position in the lengthwise direction.

13. A method as set forth in claim 12, wherein the determining step comprises:
finding peaks in the reflection signal.

14. A method as set forth in claim 12, wherein the determining step comprises:
fitting a mathematical surface model to structure positional data derived from the reflection signal.

15. A method as set forth in claim 12, further comprising:
propagating the metrology laser beam along the propagation path as the metrology laser beam spot moves along said one of said rows, thereby generating the reflection as the metrology laser beam spot moves over multiple structures in said one of said rows; and
averaging positional reflection data from multiple structures.

16. A method as set forth in claim 12, further comprising:
moving the metrology laser beam relative to the semiconductor substrate in a direction opposite to said direction; and
repeating the generating, propagating, and detecting steps as the metrology laser beam moves across links in said one of said rows in said opposite direction.

17. A method as set forth in claim 12, further comprising:
moving the metrology laser beam relative to the semiconductor substrate in a direction not parallel to said direction; and
repeating the generating, propagating, and detecting steps as the metrology laser beam moves across links in said one of said rows in said not parallel direction.

18. A method as set forth in claim 12, further comprising:
adjusting the focusing depth of the metrology laser beam as the metrology laser beam spot moves; and
wherein the determining step comprises determining a depth of a structure in the semiconductor substrate.

19. A method as set forth in claim 1, wherein the determining step comprises:
comparing data derived from the reflection signal to data indicating a nominal position of the structure.

20. A method as set forth in claim 1, wherein the semiconductor substrate further comprises one or more dedicated alignment targets, and the method further comprises:
propagating the metrology laser beam along a propagation path to a metrology laser beam spot on or near one of the dedicated alignment targets;
detecting a reflection of the metrology laser beam from said one of the dedicated alignment targets, thereby generating a reflection signal; and determining, based on the reflection signal, a preliminary position of the metrology laser beam spot relative to the semiconductor substrate.

21. A computer-readable medium for use with a system for positioning a laser beam spot relative to a semiconductor substrate, the computer-readable medium comprising software instructions performing the method of claim 1.

22. A method according to claim 1 wherein at least some of said structures are arranged in a predetermined synchronization pattern.

23. A method according to claim 22 wherein the synchronization pattern is a Barker code pattern.

24. A method according to claim 1 wherein the structures are arranged in a plurality of substantially parallel rows extending in a generally lengthwise direction, and wherein a width of the structures in the lengthwise direction, a pitch between the structures in the lengthwise direction, and a size of the metrology laser beam spot cooperate to yield an appreciably detectable reflection contrast between the structures and areas of the semiconductor substrate between adjacent structures.

25. A system for positioning a laser beam spot relative to a semiconductor substrate having structures on or within the semiconductor substrate to be selectively processed by delivering a processing laser beam to a processing laser beam spot, the system comprising:
a means for generating a metrology laser beam, wherein the metrology laser beam is different from the processing laser beam;
a means for propagating the metrology laser beam along a propagation path to a metrology laser beam spot on or near a structure to be selectively processed;
a means for detecting a reflection of the metrology laser beam from the structure, thereby generating a reflection signal, while the angular velocity of the semiconductor substrate about its approximate center is no more than negligible; and
a means for determining, based on the reflection signal, a position of the metrology laser beam spot relative to the structure.

26. A system for positioning a laser beam spot relative to a semiconductor substrate having structures on or within the semiconductor substrate to be selectively processed by delivering a processing laser beam to a processing laser beam spot, the system comprising:
a laser producing a metrology laser beam, wherein the metrology laser beam is different from the processing laser beam;
a propagation path from the laser to a metrology laser beam spot on or near a structure to be selectively processed;
a sensor positioned to detect a reflection of the metrology laser beam from the structure, thereby generating a reflection signal, while the angular velocity of the semiconductor substrate about its approximate center relative to the laser beam spot is no more than negligible; and
a controller, connected to the sensor, the controller being configured to determine, based on the reflection signal, a position of the metrology laser beam spot relative to the structure.

27. A system as set forth in claim 26, further comprising:
a position sensor configured to measure the position of the semiconductor substrate: and
a position database indicating nominal locations of the structures, wherein the controller is configured to determine a relationship between the nominal positions and measured positions of the structures as indicated by the reflection signal.

28. A system as set forth in claim 27, further comprising:
a processing laser producing a processing laser beam;
a propagation path from the processing laser to a processing laser beam spot on or near a structure to be selectively processed; and
a motion stage configured to cause relative motion between the semiconductor substrate and the processing laser beam spot; wherein the motion stage is connected to the controller and the controller is configured to cause an adjustment of the position of the semiconductor substrate relative to the processing laser beam spot, based of the reflection signal, so as to cause the processing laser beam spot to better overlap a selected structure when the processing laser is turned on.

29. A system as set forth in claim 27, further comprising one or more processing lasers producing multiple processing laser beams;
multiple propagation paths from the one or more processing lasers to respective processing laser beam spots on or near structures to be selectively processed; and
a motion stage is configured to cause relative motion between the semiconductor substrate and the multiple processing laser beam spots; wherein the motion stage is connected to the controller and the controller is configured to cause an adjustment of the position of the semiconductor substrate relative to the processing laser beam spots, based of the reflection signal, so as to cause the processing laser beam spots to better overlap a selected structure when at least one of the one or more processing lasers is turned on.

30. A system as set forth in claim 29, wherein the structures are arranged in a plurality of substantially parallel rows extending in a generally lengthwise direction, and the processing laser beam spots are offset from each other along the lengthwise direction.

31. A method for positioning the delivery of a laser beam to a structure on or within a semiconductor substrate to be selectively processed by a processing laser beam, the method comprising:
generating a metrology laser beam having a metrology laser beam spot that intersects the substrate, wherein the metrology laser beam is different from the processing laser beam;
propagating the metrology laser beam along a propagation path to the metrology laser beam spot on or near the structure to be selectively processed;
detecting a reflection of the metrology laser beam from the structure, thereby generating a reflection signal; and
detecting when the reflection signal crosses a threshold; and
responsive to said detecting step, generating the processing laser beam and propagating the processing laser beam to the structure where the reflection of the metrology beam was detected.

32. A method as set forth in claim 31, wherein the structures are arranged in a plurality of substantially parallel rows extending in a generally lengthwise direction, and the method comprises:
moving the metrology laser beam spot relative to the semiconductor substrate in a direction substantially parallel to the lengthwise direction of the rows, along one of said rows;
repeating the generating, propagating, and detecting steps as the metrology laser beam moves across links in said one of said rows, wherein the reflection signal is a function of position in the lengthwise direction; and
moving the processing laser beam spot along substantially the same path as traversed by the metrology laser beam spot, behind the metrology laser beam spot.

33. A method as set forth in claim 31, further comprising:
delaying generating the processing laser beam until the processing laser beam spot is in a position relative to the substrate such that the processing laser beam hits the structure.

34. A method as set forth in claim 31, further comprising:
propagating the processing laser beam to the structure only if the structure has been identified as one to be processed.

35. A method for positioning a laser beam spot relative to a disc-shaped semiconductor substrate having structures on or within the semiconductor substrate to be selectively processed by delivering a processing laser beam to a processing laser beam spot, the semiconductor substrate having a diameter, the method comprising:

generating a metrology laser beam distinct from the processing laser beam;

propagating the metrology laser beam along a propagation path to a metrology laser beam spot;

moving the metrology laser beam spot relative to the semiconductor substrate along a path on the semiconductor substrate, wherein the path goes over or near a structure to be selectively processed, and wherein the path has a length less than the diameter of the semiconductor substrate;

detecting a reflection of the metrology laser beam from the structure, thereby generating a reflection signal; and determining, based on the reflection signal, a position of the structure relative to the metrology laser beam spot.

36. A method according to claim 35, further comprising:

positioning, based on the reflection signal, the processing laser beam spot relative to the semiconductor substrate so as to direct the processing laser beam on selected structures.

37. A method for positioning a laser beam spot relative to a semiconductor substrate having structures on or within the semiconductor substrate to be selectively processed by delivering a processing laser beam to a processing laser beam spot, the semiconductor substrate having a center, the method comprising:

generating a metrology laser beam;

propagating the metrology laser beam along a propagation path to a metrology laser beam spot, wherein the metrology laser beam spot is independent of the processing laser beam spot;

moving the metrology laser beam spot relative to the semiconductor substrate along a path on the semiconductor substrate, wherein the path goes over or near a structure to be selectively processed, and wherein the path does not encircle the center of the semiconductor substrate;

detecting a reflection of the metrology laser beam from the structure, thereby generating a reflection signal; and determining, based on the reflection signal, a position of the structure relative to the metrology laser beam spot.

38. A method according to claim 36, further comprising:

positioning, based on the reflection signal, the processing laser beam spot relative to the semiconductor substrate so as to direct the processing laser beam on selected structures.

39. A method for positioning a laser beam spot relative to a semiconductor substrate having structures on or within the semiconductor substrate to be selectively processed by delivering a processing laser beam to a processing laser beam spot, the method comprising:

generating a metrology laser beam distinct from the processing laser beam;

propagating the metrology laser beam along a propagation path to a metrology laser beam spot;

moving the metrology laser beam spot relative to the semiconductor substrate along a plurality of spot paths on the semiconductor substrate, wherein one or more of the spot paths goes over or near a structure to be selectively processed, and wherein the metrology laser beam spot stops relative to the semiconductor substrate between the paths;

detecting a reflection of the metrology laser beam from the structure, thereby generating a reflection signal; and determining, based on the reflection signal, a position of the structure relative to the metrology laser beam spot.

40. A method according to claim 37 further comprising:

positioning, based on the reflection signal, the processing laser beam spot relative to the semiconductor substrate so as to direct the processing laser beam on selected structures.

* * * * *

UNITED STATES PATENT AND TRADEMARK OFFICE
CERTIFICATE OF CORRECTION

PATENT NO. : 7,315,038 B2
APPLICATION NO. : 11/213329
DATED : January 1, 2008
INVENTOR(S) : Kelly J. Bruland It is certified that error appears in the above-identified patent and that said Letters Patent is hereby corrected as shown below:

The title page consisting of the illustrated figure 2 should be deleted to appear as per attached title page.

The sheet of drawing consisting of figure 2 should be deleted to appear as per attached figure 2.

Signed and Sealed this

Eighth Day of September, 2009

David J. Kappos
*Director of the United States Patent and Trademark Office*

(12) United States Patent
Bruland

(10) Patent No.: US 7,315,038 B2
(45) Date of Patent: *Jan. 1, 2008

(54) METHODS AND SYSTEMS FOR POSITIONING A LASER BEAM SPOT RELATIVE TO A SEMICONDUCTOR INTEGRATED CIRCUIT USING A PROCESSING TARGET AS AN ALIGNMENT TARGET

(75) Inventor: Kelly J. Bruland, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/213,329

(22) Filed: Aug. 26, 2005

(65) Prior Publication Data
US 2007/0045574 A1   Mar. 1, 2007

(51) Int. Cl.
*G01N 21/00* (2006.01)
*B23K 26/00* (2006.01)

(52) U.S. Cl. ............ 250/559.3; 250/559.29; 250/548; 356/614; 356/620; 438/128; 438/132; 219/121.6; 219/121.68; 219/121.69; 219/121.85

(58) Field of Classification Search ......... 250/548, 250/559.3, 559.29; 219/121.6, 121.68, 121.69, 219/121.82, 121.83, 121.85; 356/614, 620, 356/622; 438/128, 132
See application file for complete search history.

(56) References Cited

U.S. PATENT DOCUMENTS

| | | | |
|---|---|---|---|
| 4,358,659 A | 11/1982 | Spohnheimer | |
| 4,780,590 A | 10/1988 | Griner et al. | |
| 4,809,014 A | 2/1989 | Kempter et al. | |
| 4,877,175 A | 10/1989 | Jones et al. | |
| 4,941,082 A | 7/1990 | Pailthorp et al. | |
| 5,869,383 A | 2/1999 | Chien et al. | |
| 6,172,325 B1 | 1/2001 | Baird et al. | |
| 6,320,243 B1 | 11/2001 | Jeong et al. | |
| 6,483,071 B1 | 11/2002 | Hunter et al. | |
| 6,573,473 B2 | 6/2003 | Hunter et al. | |
| 6,593,542 B2 | 7/2003 | Baird et al. | |
| 6,750,424 B2 | 6/2004 | Tanaka | |

(Continued)

FOREIGN PATENT DOCUMENTS

DE     102 34 943.6    7/2002

(Continued)

OTHER PUBLICATIONS

International Search Report and Written Opinion of PCT/US2006/032944, Dec. 28, 2006.

*Primary Examiner*—Davienne Monbleau
(74) *Attorney, Agent, or Firm*—Stoel Rives LLP

(57) ABSTRACT

A method and system position a laser beam spot relative to a semiconductor substrate having structures on or within the semiconductor substrate to be selectively processed by delivering a processing laser beam to a processing laser beam spot. The method generates a metrology laser beam and propagates the metrology laser beam along a propagation path to a metrology laser beam spot on or near a structure to be selectively processed. The method detects a reflection of the metrology laser beam from the structure, thereby generating a reflection signal, and determining, based on the reflection signal, a position of the metrology laser beam spot relative to the structure.

40 Claims, 9 Drawing Sheets